(12) United States Patent  
Kim et al.

(10) Patent No.: US 7,771,021 B2
(45) Date of Patent: Aug. 10, 2010

(54) INKJET HEAD ASSEMBLY AND PRINTING APPARATUS WITH ULTRAVIOLET EMITTING UNIT AND METHOD USING THE SAME

(75) Inventors: Woo-sik Kim, Yongin-si (KR); Seong-jin Kim, Yongin-si (KR); Seung-joo Shin, Yongin-si (KR); Sung-wook Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 509 days.

(21) Appl. No.: 11/766,933

(22) Filed: Jun. 22, 2007

(65) Prior Publication Data  
US 2008/0204516 A1 Aug. 28, 2008

(30) Foreign Application Priority Data  
Feb. 28, 2007 (KR) .................. 10-2007-0020594

(51) Int. Cl.  
*B41J 2/14* (2006.01)  
*B41J 2/16* (2006.01)  
(52) U.S. Cl. .................. 347/51; 347/9; 347/101  
(58) Field of Classification Search .................. 347/20, 347/51, 54–56, 61–65, 67, 101, 103, 105–107  
See application file for complete search history.

(56) References Cited  
U.S. PATENT DOCUMENTS 4,492,966 A * 1/1985 Seki et al. .................. 346/33 A  
6,953,245 B2 * 10/2005 Shirakawa .................. 347/102  
6,973,710 B2 * 12/2005 Kiguchi et al. .................. 29/601

* cited by examiner

*Primary Examiner*—Juanita D Stephens  
(74) *Attorney, Agent, or Firm*—Stanzione & Kim, LLP

(57) ABSTRACT

An inkjet head assembly and a printing method using the same. The inkjet head assembly includes an ultraviolet (UV) emitting unit to emit UV light, and a printhead to move together with the UV emitting unit and to eject ink through nozzles using inkjet technology.

19 Claims, 2 Drawing Sheets

INKJET HEAD ASSEMBLY AND PRINTING APPARATUS WITH ULTRAVIOLET EMITTING UNIT AND METHOD USING THE SAME

CROSS-REFERENCE TO RELATED APPLICATIONS

This application claims the benefit of Korean Patent Application No. 10-2007-0020594, filed on Feb. 28, 2007, in the Korean Intellectual Property Office, the disclosure of which is incorporated herein in its entirety by reference.

BACKGROUND OF THE INVENTION

1. Field of the Invention

The present general inventive concept relates to an inkjet head assembly of an inkjet printer, and more particularly, to an inkjet head assembly, which can reduce a print linewidth, and a printing apparatus and method using the inkjet head assembly.

2. Description of the Related Art

In general, inkjet printers are devices for printing a predetermined color image by ejecting a small volume of droplet of printing ink from a printhead at a desired position on a print medium. Printheads are largely categorized into two types depending on an ink ejection mechanism: thermal inkjet printheads in which a heat source is employed to form and expand bubbles in ink, thereby ejecting ink droplets, and piezoelectric inkjet printheads in which a piezoelectric element is deformed to exert pressure on ink, thereby ejecting ink droplets.

Inkjet printers have recently been applied to other fields as well as image forming apparatuses, for example, to printed electronics that manufactures electrical and electronic components, such as electrical wires or thin film transistors (TFTs), using printing technologies. Inkjet printers applied to printed electronics eject a functional ink, such as a metal ink or a conductive ink, onto a substrate from a printhead, thereby manufacturing electrical wires or electronic circuits. Electrical wires or electronic circuits are generally formed by lithography. However, lithography has a problem in that as a panel on which electronic devices are printed becomes large, large quantities of waste materials are generated, thereby increasing the risk of environmental pollution. In order to solve the problem, various attempts have recently been made to manufacture electrical wires or electronic circuits using inkjet printing.

A minimum ejection volume of currently marketed printheads is approximately 1 pl, thereby making it possible to obtain a minimum print linewidth of 10 μm or so. In order to highly integrate circuits, a print linewidth needs to be reduced below 10 μm. In order to obtain a print linewidth less than 10 μm, however, printheads need to have a minimum ejection volume of less than 1 pl. Even though such printheads are developed, the volume of ejected ink is so small that droplets of the ink may be blown into the air, thereby degrading the linearity of the ink droplets.

SUMMARY OF THE INVENTION

The present general inventive concept provides an inkjet head assembly, which can reduce a print linewidth, and a printing method using the inkjet head assembly.

Additional aspects and utilities of the present general inventive concept will be set forth in part in the description which follows and, in part, will be obvious from the description, or may be learned by practice of the general inventive concept.

The foregoing and/or other aspects and utilities of the present general inventive concept may be achieved by providing an inkjet head assembly including an ultraviolet (UV) emitting unit to emit UV light, and a printhead to move together with the UV emitting unit and to eject ink through nozzles using inkjet technology.

The UV emitting unit may be disposed in front of the printhead based on a direction in which the inkjet head assembly moves.

The UV emitting unit may emit UV light to a substrate having an ink-phobic surface to form an ink-philic pattern on the ink-phobic surface of the substrate. The ink-philic pattern may have a width of less than 10 μm.

The printhead disposed behind the UV emitting unit may eject ink to the ink-philic pattern formed by the UV emitting unit. The ink ejected by the printhead may gather toward the ink-philic pattern to form a print pattern having a print linewidth corresponding to the ink-philic pattern.

The nozzles may be arranged on the printhead in one row along the direction in which the inkjet head assembly moves, and the UV emitting unit may emit one UV beam corresponding to the one row of nozzles. The UV emitting unit may be a laser diode (LD) or a light emitting diode (LED).

The nozzles may be arranged on the printhead in a plurality of rows, and the UV emitting unit may emit a plurality of UV beams corresponding to the plurality of rows of nozzles. The UV emitting unit may be an LD array or an LED array. The inkjet head assembly may further comprise at least one lens condensing the plurality of UV beams emitted from the UV emitting unit.

The printhead may be a thermal printhead or a piezoelectric printhead. The UV emitting unit may include a beam shaper that reshapes the ink-philic pattern into various forms.

The foregoing and/or other aspects and utilities of the present general inventive concept may also be achieved by providing a printing method using an inkjet head assembly, the printing method including preparing a substrate having an ink-phobic surface, emitting UV light to the substrate using the UV emitting unit to form an ink-philic pattern on the ink-phobic surface of the substrate, and ejecting ink to the ink-philic pattern of the substrate using a printhead moving together with the UV emitting unit and ejecting ink through nozzles.

The substrate may be a substrate formed of an ink-phobic material or a substrate having a surface on which an ink-phobic coating is formed.

The foregoing and/or other aspects and utilities of the present general inventive concept may also be achieved by providing an apparatus to form an ink pattern in an image forming apparatus, including an inkjet head assembly having an ultraviolet (UV) emitting unit and a printhead, and a controller to control the UV emitting unit to emit UV light on a portion of a substrate, and to control the printhead to move together with the UV emitting unit and to eject ink through nozzles on the portion of substrate.

The apparatus may further include a driving unit to drive the UV emitting unit and the printhead to move with respect to the substrate in a print direction.

The substrate may include an ink-phobic portion and an ink-philic portion formed by the UV light, and a print image may be formed on the ink-philic portion of the substrate with the ejected ink.

The foregoing and/or other aspects and utilities of the present general inventive concept may also be achieved by providing an image forming apparatus, including an inkjet head assembly having a light emitting unit and a printhead, and a controller to control the light emitting unit to emit light on a substrate, and to control the printhead to eject ink toward the substrate.

The foregoing and/or other aspects and utilities of the present general inventive concept may also be achieved by providing an apparatus to form an image in an image forming apparatus, the apparatus including a printhead to eject ink on a substrate formed with an ink-phobic portion and an ink-philic portion such that the ink is deposited on the ink-philic portion of the substrate.

The foregoing and/or other aspects and utilities of the present general inventive concept may also be achieved by providing a substrate usable with an image forming apparatus, the substrate being formed with an ink-phobic portion and an ink-philic portion such that ink is deposited on the ink-philic portion of the substrate.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
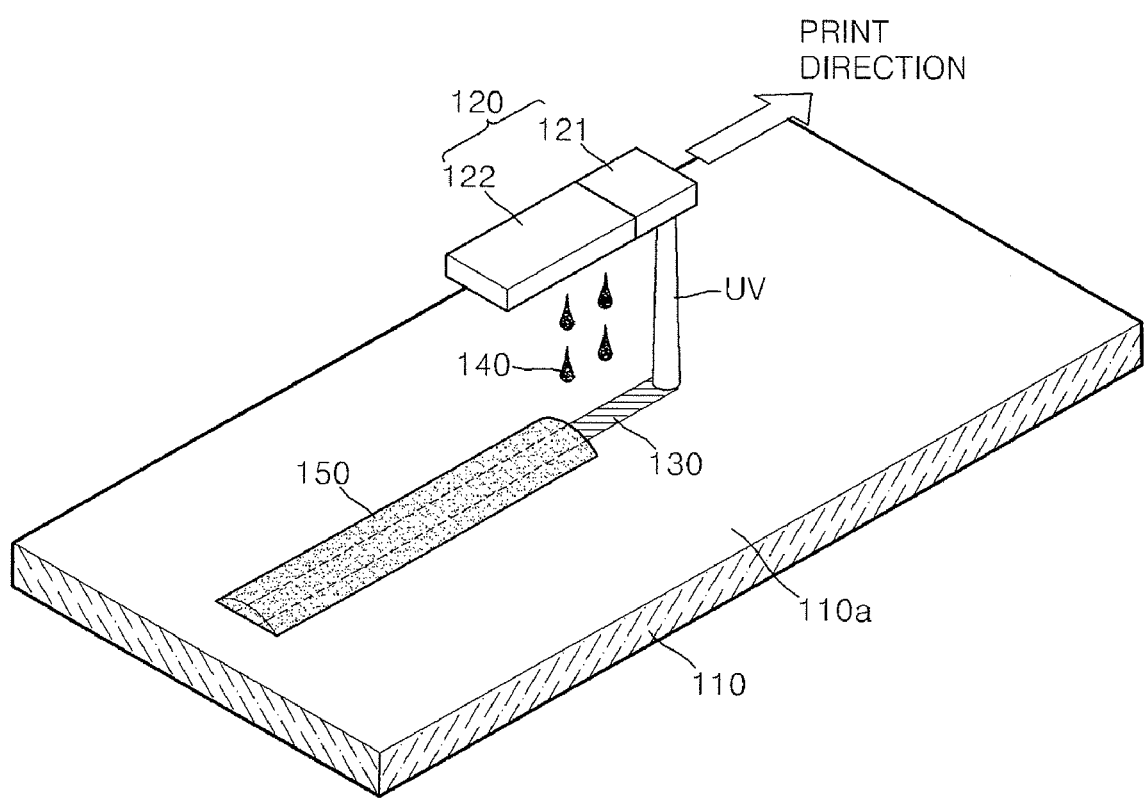
FIGS. 1 and 2 are perspective views illustrating an inkjet head assembly and a printing method using the same according to an embodiment of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

FIG. 1 is a perspective view illustrating an inkjet head assembly 120 according to an embodiment of the present general inventive concept.

Referring to FIG. 1, the inkjet head assembly 120 includes an ultraviolet (UV) emitting unit 121 to emit UV light, and a printhead 122 to eject ink using inkjet technology. The printhead 122 may be a piezoelectric inkjet head or a thermal inkjet head. The UV emitting unit 121 is disposed in front of the printhead 122 in a print direction, that is, a direction in which the inkjet head assembly 120 moves. The UV emitting unit 121 emits one or a plurality of UV beams to a substrate 110. The UV emitting unit 121 may be a laser diode (LD) or a light emitting diode (LED) to emit the UV light. When the UV emitting unit 121 emits a plurality of UV beams, the UV emitting unit 121 may be an LD array or an LED array. When the UV emitting unit 121 is an LED or an LED array, at least one lens (not shown) may be further provided to condense the plurality of UV beams. The UV emitting unit 121 may emit UV light to a substrate 110 having an ink-phobic surface 110a to form an ink-philic pattern 130 with a predetermined width, for example, a width of less than 10 μm, on at least o portion of the ink-phobic surface 110a of the substrate 110. The UV emitting unit 121 may further include a beam shaper (not shown) to reshape the ink-philic pattern 130 into various forms.

The inkjet head assembly 120 may move with respect to the substrate 110, and the substrate 110 is stationary. It is possible that the inkjet head assembly 120 is stationary when the substrate 110 moves with respect to the inkjet head assembly 120.

The printhead 122 is coupled to the UV emitting unit 121 and moves together with the UV emitting unit 121 to perform a printing operation. A plurality of nozzles (not shown) through which ink is ejected are formed on the printhead 122. The nozzles may be arranged on the printhead 122 in one row or a plurality of rows. In detail, when the nozzles are arranged in one row along a direction in which the printhead 122 moves, the UV emitting unit 121 may be an LD or an LED emitting one UV beam corresponding to the one row of nozzles. When the nozzles are arranged on the printhead 122 in a plurality of rows, the UV emitting unit 121 may be an LD array or an LED array to emit a plurality of UV beams corresponding to the plurality of rows of nozzles.

Ink used in the printhead 122 may be a functional ink such as a metal ink or a conductive ink. The printhead 122 may be disposed behind the UV emitting unit 121 to eject ink droplets 140 onto the ink-philic pattern 130 formed by the UV emitting unit 121. Accordingly, ink 150 ejected to the substrate 110 from the printhead 122 gathers toward the ink-philic pattern 130 to form a print pattern 160 (see FIG. 2) having a linewidth d (see FIG. 2) corresponding to the width of the ink-philic pattern 130. The printhead 122 may be a thermal printhead in which a heat source is used to form and expand bubbles in ink, thereby propelling ink droplets, or a piezoelectric printhead in which a piezoelectric element is deformed to exert press on ink, thereby propelling ink droplets.

Since the UV light is used to form the ink-philic pattern 130, an area or a line of the ink-philic pattern 130 can be formed to have a very narrow width in a vertical direction of the head assembly moving direction or the print direction. Also, since the ink is not likely deposited on the ink-phobic area but on the ink-philic pattern 130, a print area or line formed with the ink on the area or line of the ink-philic pattern 130 can be significantly reduced in width even when a size or volume of the ink droplets ejected from the printhead 122 is not reduced.

A printing method using the inkjet head assembly 120 according to an embodiment of the present general inventive concept will now be explained with reference to FIGS. 1 and 2.

Referring to FIG. 1, the substrate 110 having the ink-phobic surface 110a is prepared. The substrate 110 may be a substrate formed of an ink-phobic material or a glass substrate on which an ink-phobic coating is formed. Next, the inkjet head assembly 120 is placed above the substrate 110, and is forced to move in a print direction to perform a printing operation. The UV emitting unit 121 is disposed in front of the printhead 122 in the print direction, that is, the direction in which the inkjet head assembly 120 moves. In detail, when the UV emitting unit 121 of the inkjet head assembly 120 emits UV light to the substrate 110 having the ink-phobic surface 110a, a portion of the ink-phobic surface 110a of the substrate 110 to which the UV light is emitted is changed from an ink-phobic state into an ink-philic state to form the ink-philic pattern 130 of a predetermined shape. The ink-philic pattern 130 formed on the ink-phobic surface 110a of the substrate 110 may have a width of less than 10 μm.

Next, when the inkjet head assembly 120 moves in the print direction, the printhead 122 ejects the ink droplets 140 onto the ink-philic pattern 130 formed on the ink-phobic surface 110a of the substrate 110 by the UV emitting unit 121 that is disposed in front of the printhead 122. A minimum ejection volume of ink droplets 140 ejected from the respective nozzles (not shown) of the printhead 122 is approximately 1 pl corresponding to a print linewidth of approximately 10 μm. Accordingly, when the ink-philic pattern 130 formed on the ink-phobic surface 110a of the substrate 110 has a width of less than 10 μm, the ink 150 ejected onto the substrate 110 from the printhead 122 covers the ink-philic pattern 130 and the ink-phobic surface 110a around the ink-philic pattern 13. The ink 150 covering the ink-philic pattern 130 and the ink-phobic surface 110a around the ink-philic pattern 13 tends to gather toward the ink-philic pattern 130, such that the print pattern 160 corresponding to the ink-philic pattern 130 may be formed on the ink-phobic surface 110a of the substrate 110 as illustrated in FIG. 2. The print pattern 160 may have a print linewidth d equal to the width of the ink-philic pattern 130, for example, a narrow print linewidth of less than 10 μm.

In the inkjet head assembly 120, the printhead 122 and the UV emitting unit 121 may be detachably attached to each other. The printhead 122 and the UV emitting unit 121 may be formed in a single monolithic body. The nozzles of the printhead 122 may be disposed on a line spaced-apart from the UV emitting unit 121 by a predetermined distance to provide a period of time between UV emitting time and ink ejecting time. For example, the period time may be a time taken to change the substrate 110 from the ink-phobic state to the ink-philic state.

Figure 2:
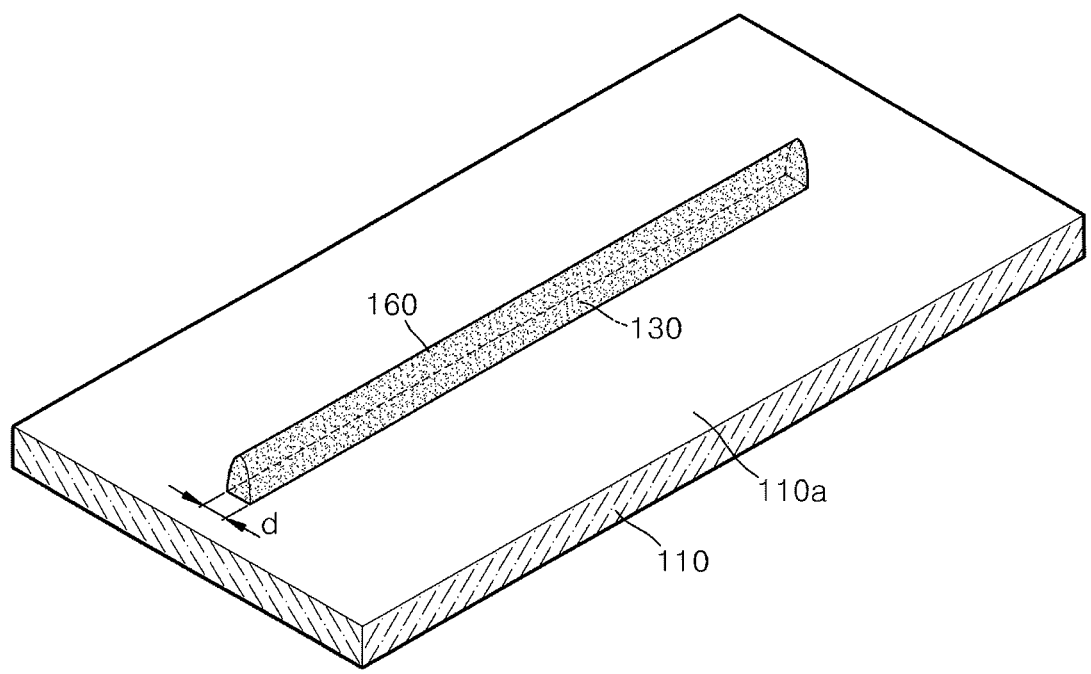

While the nozzles are arranged on the printhead 122 in one row along the direction in which the inkjet head assembly 120 moves and the UV emitting unit 121, e.g., LD or LED, emits one UV beam corresponding to the one row of nozzles in FIGS. 1 and 2, the present general inventive concept is not limited thereto and thus the nozzles may be arranged on the printhead 122 in a plurality of rows and the UV emitting unit 121, e.g., LD array or LED array, may emit a plurality UV beams corresponding to the plurality of rows of nozzles.

Figure 3:
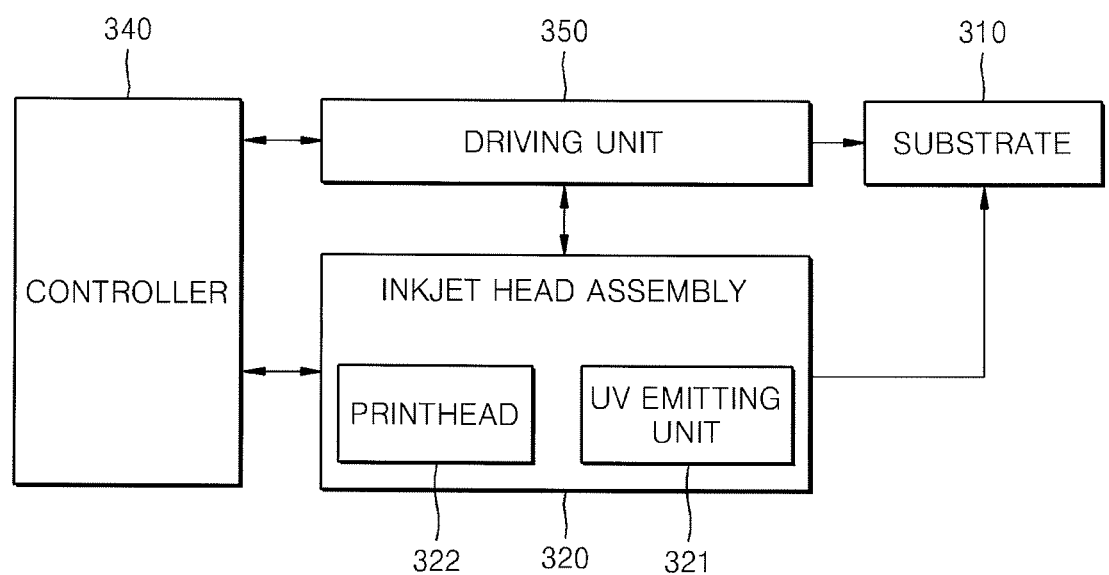
FIG. 3 is a view illustrating an apparatus to form an image on a substrate according to an embodiment of the present general inventive concept.

FIG. 3 is a view illustrating an apparatus to form an image on a substrate according to an embodiment of the present general inventive concept. Referring to FIGS. 1, 2, and 3, the apparatus includes a substrate 310, an inkjet head assembly 320, a driving unit 350, and a controller 350. The inkjet head assembly 320 may include a printhead 322 and a light emitting unit 321, such as a UV emitting unit. The inkjet head assembly 320 may be similar to the inkjet head assembly 110 of FIG. 1. The substrate 310 may be similar to the substrate 110 of FIGS. 1 and 2. The driving unit 350 drives the inkjet head assembly 320 and the substrate 310 to make a relative movement between them. That is, when the substrate 310 is stationary, the driving unit 350 controls the inkjet head assembly 320 to relatively move with respect to the substrate 210. It is possible that when the inkjet head assembly 320 is stationary, the driving unit 350 may control the substrate to relatively move with respect to the inkjet head assembly 320. The controller 360 controls components thereof, for example, the driving unit 350 and the inkjet head assembly 320, to perform a printing operation as described above. The controller controls the UV emitting unit 321 to emit the UV light, and the printhead 322 to eject ink a predetermined time after the UV light is emitted on the substrate 310.

As described above, according to the present general inventive concept, since the UV emitting unit 121 emits UV light to the substrate 110 having the ink-phobic surface 110a to form the ink-philic pattern 130 and the printhead 122 ejects ink onto the ink-philic pattern 130 formed by the UV emitting unit 121 disposed in front of the printhead 122, the print pattern 160 corresponding to the ink-philic pattern 130 can be formed. Hence, the print pattern 160 can have a fine print linewidth of less than 10 μm, thereby making it possible to highly integrate circuits.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. An inkjet head assembly comprising:
   an ultraviolet (UV) emitting unit to emit UV light to a substrate having an ink-phobic surface to form an ink-phillic pattern on the ink-phobic surface of the substrate; and
   a printhead to move together with the UV emitting unit and to eject ink through nozzles using an inkjet method,
   wherein the nozzles are arranged on the printhead in one row along the direction in which the inkjet head assembly moves, and the UV emitting unit emits one UV beam corresponding to the one row of nozzles.

2. The inkjet head assembly of claim 1, wherein the UV emitting unit is disposed in front of the printhead in a direction in which the inkjet head assembly moves.

3. The inkjet head assembly of claim 1, wherein the ink-philic pattern has a width of less than 10 μm.

4. The inkjet head assembly of claim 1, wherein the printhead disposed behind the UV emitting unit ejects ink to the ink-philic pattern formed by the UV emitting unit.

5. The inkjet head assembly of claim 4, wherein the ink ejected on the substrate by the printhead gathers toward the ink-philic pattern to form a print pattern having a print linewidth corresponding to the ink-philic pattern.

6. The inkjet head assembly of claim 4, wherein the nozzles are arranged on the printhead in a plurality of rows, and the UV emitting unit emits a plurality of UV beams corresponding to the plurality of rows of nozzles.

7. The inkjet head assembly of claim 6, wherein the UV emitting unit is an LD array or an LED array.

8. The inkjet head assembly of claim 7, further comprising:
   at least one lens condensing the plurality of UV beams emitted from the UV emitting unit.

9. The inkjet head assembly of claim 1, wherein the UV emitting unit is a laser diode (LD) or a light emitting diode (LED).

10. The inkjet head assembly of claim 9, further comprising:
    at least one lens condensing the plurality of UV beams emitted from the UV emitting unit.

11. The inkjet head assembly of claim 1, wherein the printhead is a thermal printhead or a piezoelectric printhead.

12. An inkjet head assembly comprising:
    an ultraviolet (UV) emitting unit to emit UV light; and
    a printhead to move together with the UV emitting unit and to eject ink through nozzles using an inkjet method;
    wherein the UV emitting unit includes a beam shaper that reshapes an ink-philic pattern into various forms.

13. A printing method using an inkjet head assembly, the printing method comprising:
    preparing a substrate having an ink-phobic surface;
    emitting UV light to the substrate using a UV emitting unit to form an ink-philic pattern on the ink-phobic surface of the substrate; and
    ejecting ink to the ink-philic pattern of the substrate using a printhead which moves together with the UV emitting unit and ejects ink through nozzles using an inkjet method, wherein the UV emitting unit emits one or a plurality of UV beams to the substrate, and the nozzles are arranqed on the printhead in one or a plurality of rows corresponding to the number of the UV beams.

14. The printing method of claim 13, wherein the substrate is a substrate formed of an ink-phobic material or a substrate having a surface on which an ink-phobic coating is formed.

15. The printing method of claim 13, wherein the UV emitting unit is disposed in front of the printhead in a direction in which the inkjet head assembly moves.

16. The printing method of claim 15, wherein the ink-philic pattern has a width of less than 10 µm.

17. The printing method of claim 15, wherein the printhead disposed behind the UV emitting unit ejects ink to the ink-philic pattern formed by the UV emitting unit.

18. The printing method of claim 17, wherein the ink ejected by the printhead gathers toward the ink-philic pattern to form a print pattern having a print linewidth corresponding to the ink-philic pattern.

19. The printing method of claim 13, wherein the printhead is a thermal printhead or a piezoelectric printhead.

* * * * *